United States Patent
Mukherjee et al.

(10) Patent No.: US 7,565,633 B2
(45) Date of Patent: Jul. 21, 2009

(54) VERIFYING MASK LAYOUT PRINTABILITY USING SIMULATION WITH ADJUSTABLE ACCURACY

(75) Inventors: Maharaj Mukherjee, Wappingers Falls, NY (US); James A. Culp, Newburgh, NY (US); Scott M. Mansfield, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 233 days.

(21) Appl. No.: 11/619,320

(22) Filed: Jan. 3, 2007

(65) Prior Publication Data

US 2008/0163153 A1    Jul. 3, 2008

(51) Int. Cl.
*G06F 17/50* (2006.01)
(52) U.S. Cl. .................... 716/4; 716/5; 716/19; 716/21
(58) Field of Classification Search ................. 716/4–5, 716/19–21; 382/144; 430/5, 22, 30
See application file for complete search history.

(56) References Cited

U.S. PATENT DOCUMENTS

| 7,043,712 B2 | 5/2006 | Mukherjee et al. |
| 2003/0115569 A1* | 6/2003 | Ikeuchi ..................... 716/19 |
| 2006/0271905 A1 | 11/2006 | Mukherjee et al. |
| 2007/0050741 A1* | 3/2007 | Ogawa et al. .................. 716/5 |

OTHER PUBLICATIONS

U.S. Appl. No. 11/555,854 "Printability Verification By Progressive Modeling Accuracy" Mukherjee, et al., filed Nov. 2, 2006

* cited by examiner

*Primary Examiner*—Paul Dinh
(74) *Attorney, Agent, or Firm*—Todd M. C. Li; Hoffman Warnick LLC

(57) ABSTRACT

A method, system and computer program product for verifying printability of a mask layout for a photolithographic process are disclosed. A simulation of the photolithographic process for the designed mask layout is simulated using a simplified version of the mask layout with a lower accuracy to generate a lower accuracy simulated image. Where the lower accuracy simulated image is determined as potentially including an error, a further simulation of the designated portion of the mask layout with a higher accuracy will be performed.

3 Claims, 8 Drawing Sheets

VERIFYING MASK LAYOUT PRINTABILITY USING SIMULATION WITH ADJUSTABLE ACCURACY

FIELD OF THE INVENTION

The present invention relates in general to lithographic processes in integrated circuit manufacturing, and more particularly to verifying the printability of a mask layout for lithographic processing effects.

BACKGROUND OF THE INVENTION

In the manufacturing of integrated circuits, photolithography (or lithography) is typically used to transfer patterns related to the layout of an integrated circuit onto a wafer substrate including, but not limited to, materials such as silicon (Si), silicon germanium (SiGe), silicon-on-insulator (SOI), or various combinations thereof. The drive to improve the performance of very-large-scale integrated (VLSI) circuits results in the increasing requirements to decrease the size of components and to increase the density of layouts. This in turn requires the use of resolution-enhancement techniques (RET) to extend the capabilities of optical lithographic processes. RET includes techniques of optical proximity correction (OPC), sub-resolution assist feature (SRAF) enhanced lithography and phase-shifted-mask (PSM) enhanced lithography.

Applications of complex RET techniques have considerably increased the cost of masks and lithographic manufacturing. A computer-based simulation of wafer images thus becomes necessary to verify the pattern transfer capabilities (also referred to as printability) of a mask through the variability of a process before the mask is actually manufactured.

The ever increasing costs of mask manufacturing and inspection and the ever increasing complexity of OPC and RET techniques require that a mask is correctly and accurately simulated to eliminate potential defects before the mask is manufactured. This area is generally known as mask manufacturability verification or mask printability verification. An accurate simulation is the primary focus of printability verification. This means that the printability verification simulation should not miss any real error on the mask. As is appreciated, the cost of a defective mask being actually manufactured and used for chip manufacturing is extremely high. Nevertheless, there are two other important objectives of a printability verification tool. First, a simulation needs to be done as quickly as possible. As the feedback from the printability verification is used for the development of OPC and RET, a fast feedback is desirable to minimize the turn-around time (TAT) for OPC and RET developments. Second, there should be as few "false errors" as possible. A false error is defined as a mask layout error identified by a printability verification process using its simulation tool, which will not happen on a wafer if the mask is actually used in a lithographic process. Since missing a real error is significantly more expensive than identifying a false error, all printability verification tools are expected to err on the conservative side, i.e., tending to detect more errors including false errors. However, since each error, whether false or real, needs to be checked manually, it is desirable that a printability verification tool does not identify too many false errors. If there are too many false errors, the real errors may be overwhelmed and potentially missed in a manual inspection because it would be time consuming to evaluate all the false errors to find the real errors.

Current printability verification methods tend to simulate the whole mask layout image with the most accurate geometry using very conservative criteria. This tends to increase the runtime of the printability verification process along with the number of false errors. For example, the state of the art techniques simulate a mask layout (or a segment thereof) using a calibrated resist and optical model. The simulated image is then compared to the corresponding target shape. If the simulated wafer segment is not within a tolerance of the corresponding target shape, it is reported as problematic, i.e., including an error.

FIG. 1 shows an exemplary mask layout 10 with an exemplary simulated wafer image 16. Mask layout 10 includes a main mask shape(s) 12 and sub resolution assist features (SRAF) 14 that do not print themselves but help in the printing of main mask shapes 12. Simulated wafer image 16 is shown as the patterned shapes, which correspond to main mask shape 12. As shown in FIG. 1, various kinds of errors are included in simulated image 16, wherein:

20 depicts a "necking error", where the wafer image shape width is smaller than a pre-determined value;

22 depicts a "bridging error", where the spacing between two wafer image shapes is smaller than a pre-determined value;

24 depicts an "edge placement error", where the wafer image shape at an edge is divergent from a target edge, as indicated by main mask shape 12, by a predetermined value;

26 depicts an "line end shortening error", where the wafer image shape at a line-end is divergent from a target line end, as indicated by main mask shape 12, by a predetermined value;

28 depicts an SRAF printing error, where a part of the SRAF is printed; and

30 depicts additional printing errors due to, e.g., diffraction effects of lighting such as side-lobe printing errors.

The printability errors can be categorized into two categories. The errors in the first category are known as the catastrophic errors, because a circuit will fail to function at all if any of these errors occur. The other category of errors is known as the performance errors. Errors of this type do not make the circuit malfunction. But the performance of the circuit in terms of, e.g., the speed or the power consumption may degrade with such errors increasing. Examples of catastrophic errors are: necking errors 20, bridging errors 22, SRAF and additional image (such as side lobe) printing errors 28, 30. On the other hand, edge placement errors 24 are usually considered to be examples of performance errors. Line end shortening errors 26 can be categorized as catastrophic if they happen to miss any connections with the next layer in the chip due to overlay errors. All catastrophic errors in a mask layout must be corrected before the circuit is manufactured using the mask layout. On the other hand, the performance errors are considered statistically, wherein a small amount of performance errors may be tolerated across the mask layout.

The shapes on a designed mask layout (hereinafter referred to as a mask) are typically defined as/represented by polygons. For simulation purposes, the edges of each mask shape can be divided into smaller line segments. At the heart of a printability verification tool is a simulator that simulates the image intensity at a particular point, which is typically, but not necessarily, at the center of each of the line segments. While the accuracy of the verification may improve as the number of segments increases, the efficiency of a verification tool may decrease.

The segmentation of the mask shape depends on the number of edges on a polygon. The position at which an edge prints is influenced by other nearby mask polygons. Large perturbing features have a stronger influence than small features, but in general the interaction will fall off with an increasing separation distance. Partially coherent image formation is a non-linear process such that the falling off in interaction is not a fixed function of distance. However, the general scaling behavior is that of the so-called lens impulse response function, also known as the Airy function. Mathematically, the Airy function is $[J_1(2\pi \cdot s)/(\pi \cdot s)]^2$, where $J_1$ is the first Bessel function, and s is a dimensionless position coordinate in the image plane, defined as $s=x \cdot NA/\lambda$, where x is the position as measured in conventional length units, NA is the effective numerical aperture of the lithographic system, and $\lambda$ is the wavelength of the illumination light.

Any details in a mask would interact during the fragmentation procedure to create corresponding segmentations on a neighboring mask shape. Some of those fragments may be created by variations of a neighboring shape that is quite far away from the main shape. Some of those distant fragments may have very little impact on the wafer image simulation. Such distant segmentations would eventually contribute to the inefficiency of a printability verification process. This inefficiency is exacerbated by the fact that the further away a neighboring shape is located, the smaller the proximity effects on a particular mask shape. However, the conventional OPC methodologies do not take advantage of the above fact.

Based on the above; there is a need in the art for verifying mask printability in a manner that improves the efficiency of the verification while maintaining the accuracy or effectiveness of the OPC.

SUMMARY OF THE INVENTION

A method, system and computer program product for verifying printability of a mask layout for a photolithographic process are disclosed. A simulation of the photolithographic process for the designed mask layout is simulated using a simplified version of the mask layout with a lower accuracy to generate a lower accuracy simulated image. Where the lower accuracy simulated image is determined as potentially including an error, or violation of printability rules, a further simulation of the portion of the designed mask layout that corresponds to the potential error is performed using mask layout with a higher accuracy.

A first aspect of the invention is directed to a method for verifying a printability of a mask layout for a photolithographic process, the method comprising the steps of: providing a mask layout; simulating the photolithographic process having a first accuracy using a simplified version of said mask layout to generate a simulated image; and evaluating the printability of the mask layout based on the simulated image in accordance with printability rules to determine whether to adjust a simulation accuracy to a second higher accuracy.

Preferably, the simplified version of the mask layout is obtained by a smoothing process. However, the invention includes obtaining a simplified version of the mask layout in the spatial or frequency domain.

A second aspect of the invention is directed to a computer usable program code which, when executed by a computer system, is configured to perform the method steps of: providing a mask layout; simulating the photolithographic process having a first accuracy using a simplified version of said mask layout to generate a simulated image; and evaluating the printability of the mask layout based on the simulated image in accordance with printability rules to determine whether to adjust a simulation accuracy to a second higher accuracy.

A third aspect of the invention is directed to a method of generating a system for verifying a printability of a mask layout for a photolithographic process, the method comprising: providing a computer infrastructure operable to: receive data for a mask layout; simulate the photolithographic process having a first accuracy using a simplified version of said mask layout to generate a simulated image; and evaluate the printability of the mask layout based on the simulated image in accordance with printability rules to determine whether to adjust a simulation accuracy to a second higher accuracy.

Other aspects and features of the present invention, as defined solely by the claims, will become apparent to those ordinarily skilled in the art upon review of the following non-limited detailed description of the invention in conjunction with the accompanying figures.

BRIEF DESCRIPTION OF THE DRAWINGS

The embodiments of this invention will be described in detail, with reference to the following figures, wherein like designations denote like elements, and wherein.

It is noted that the drawings of the invention are not to scale. The drawings are intended to depict only typical aspects of the invention, and therefore should not be considered as limiting the scope of the invention. In the drawings, like numbering represents like elements among the drawings.

DETAILED DESCRIPTION OF THE INVENTION

The following detailed description of embodiments refers to the accompanying drawings, which illustrate specific embodiments of the invention. Other embodiments having different structures and operations do not depart from the scope of the present invention.

1. Computer System

Figure 1:
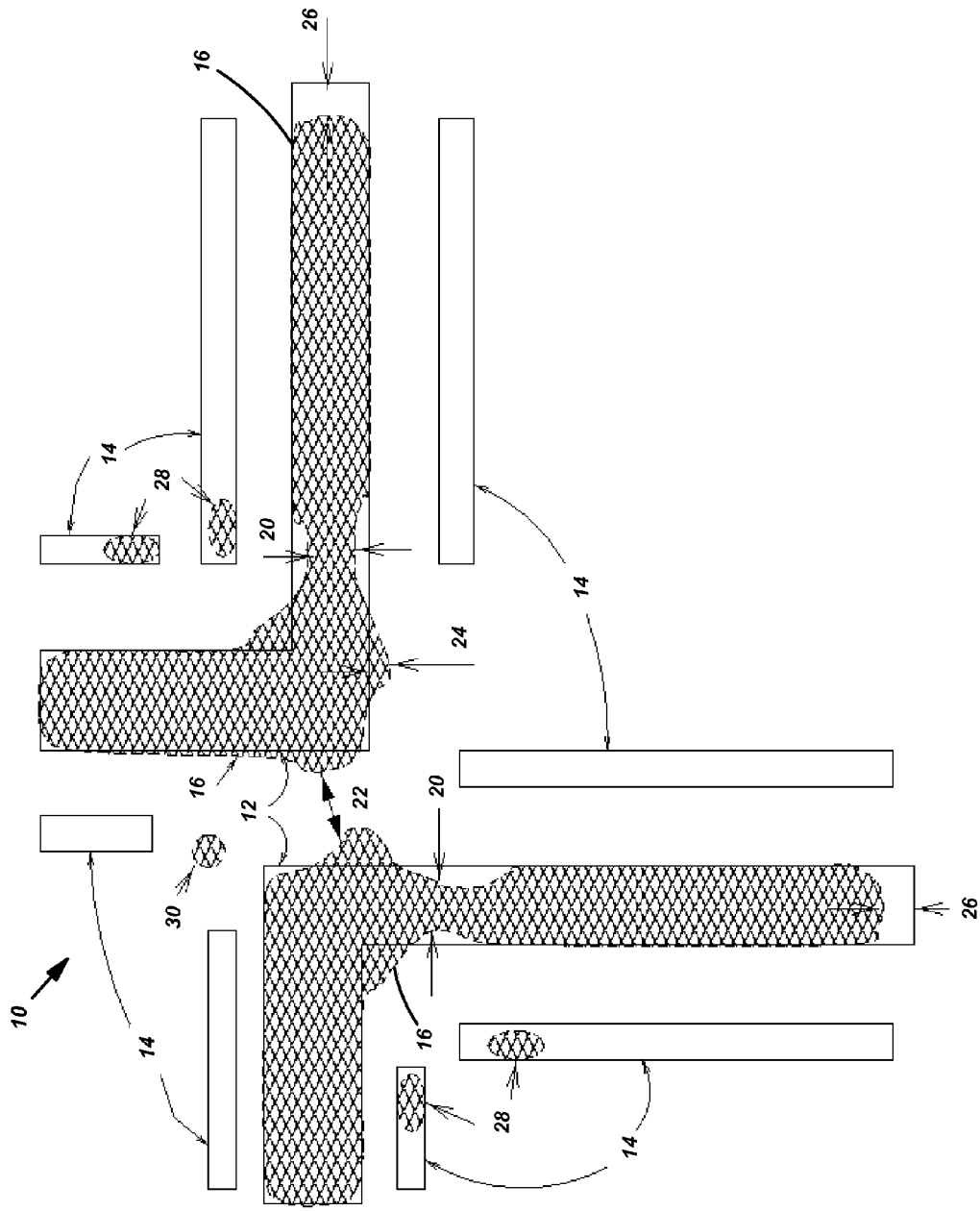
FIG. 1 shows an exemplary mask layout with an exemplary simulated wafer image, according to prior art.
Figure 2:
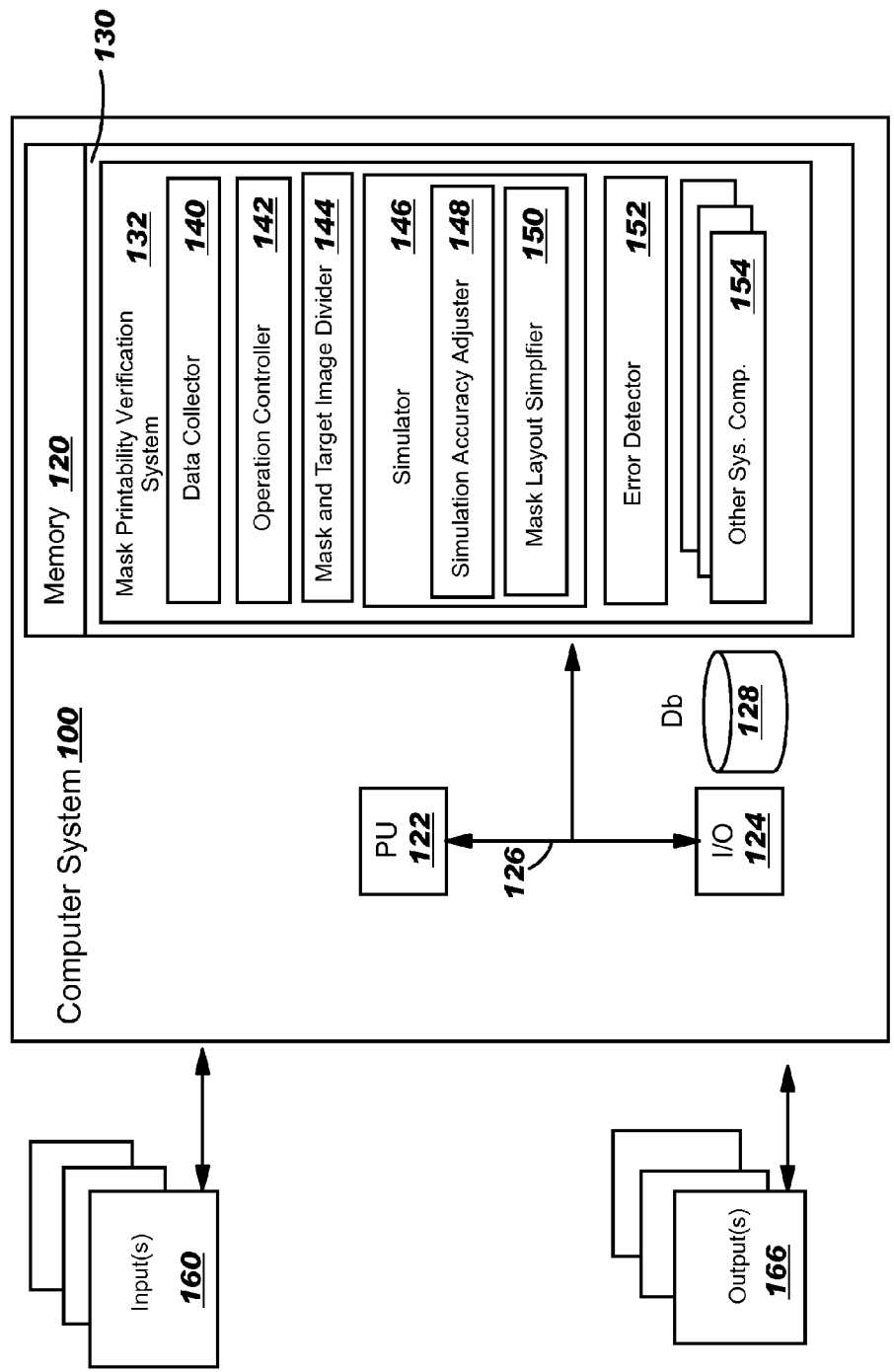
FIG. 2 shows a block diagram of an illustrative computer system according to one embodiment of the invention

Referring to FIG. 2, a block diagram of an illustrative computer system 100 according to one embodiment of the invention is shown. In one embodiment, computer system 100 includes a memory 120, a processing unit (PU) 122, input/output devices (I/O) 124 and a bus 126. A database 128 may also be provided for storage of data relative to processing tasks. Memory 120 includes a program product 130 that, when executed by PU 122, comprises various functional capabilities described in further detail below. Memory 120 (and database 128) may comprise any known type of data storage system and/or transmission media, including magnetic media, optical media, random access memory (RAM), read only memory (ROM), a data object, etc. Moreover, memory 120 (and database 128) may reside at a single physical location comprising one or more types of data storage, or be distributed across a plurality of physical systems. PU 122 may likewise comprise a single processing unit, or a plurality of processing units distributed across one or more locations. I/O 124 may comprise any known type of input/output device including a network system, modem, keyboard, mouse, scanner, voice recognition system, CRT, printer, disc drives, etc.

Additional components, such as cache memory, communication systems, system software, etc., may also be incorporated into computer system 100.

As shown in FIG. 2, program product 130 may include a mask printability verification system 132. Mask printability verification system 132 may include a data collector 140; an operation controller 142; a mask and target image divider 144; a simulator 146 including a simulation accuracy adjuster 148 and a mask layout simplifier 150; an error detector 152; and other system components 154. Other system components 154 may include any now known or later developed parts of a computer system 100 not individually delineated herein, but understood by those skilled in the art.

Inputs 160 to computer system 100 include, for example, mask inputs, target image inputs and operator inputs. Operator inputs may include, for example, instructions of an operator of computer system 100 regarding the operation of, inter alia, mask printability verification system 132. For example, an operator may instruct mask layout simplifier 150 regarding a desired degree of simplification, as will be described later. Those inputs may be communicated to computer system 100 through I/O 124 and may be stored in database 128. In the operation of mask printability verification system 132, the input data may be collected by data collector 140. Outputs 166 of computer system 100 include, for example, verification results of a designed mask layout that are communicated to, inter alia, a user or a customer who pays for the service to act accordingly. For example, if a designed mask layout has been found to include an error, a mask designer may manually check the mask design to solve the problem. The operation of mask printability verification system 132 will be described in detail below.

2. Operation Methodology

Figure 3:
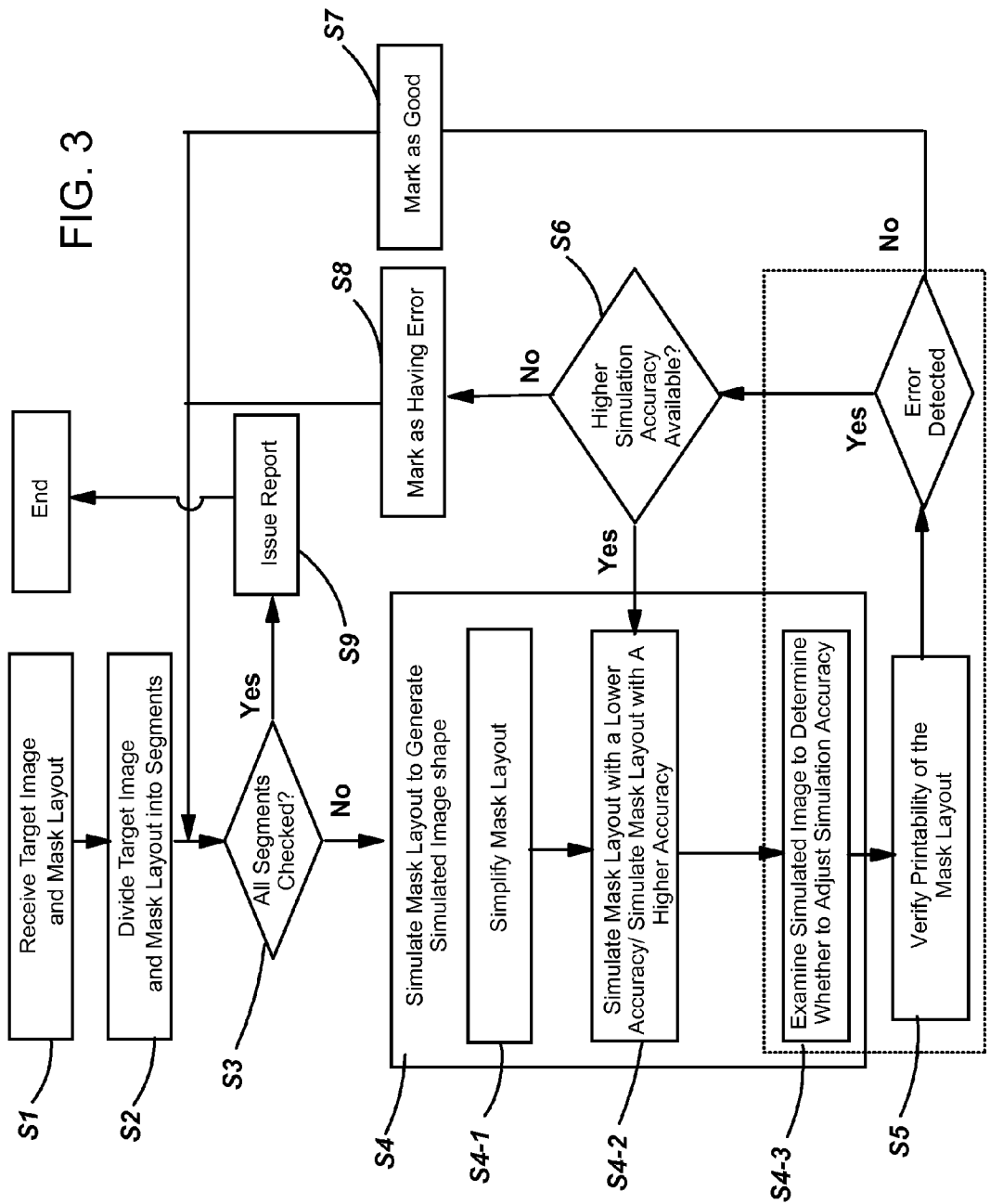
FIG. 3 shows one embodiment of the operation of a mask printability verification system according to the invention.

Mask printability verification system 132 functions generally to simulate a designed mask layout to determine whether the mask layout includes an error. FIG. 3 shows embodiments of the operation of mask printability verification system 132. Referring now to FIGS. 2-3, first in process S1, data collector 140 receives/collects data for a target image shape and a mask layout designed for the target image shape to facilitate a further analysis of the data.

Next in process S2, mask and target image divider 144 optionally divides the target image into target image segments and divides the mask layout into mask segments corresponding to each of the target image segments. As is appreciated, a finer division will increase the simulation accuracy at the cost of efficiency. An operator may instruct mask and target image divider 144 regarding how fine a division is preferred. As should be appreciated, each mask segment is associated with a region of vicinity at the boundary of the mask segment. The shapes within this region of vicinity are used as reference for computing the simulated wafer image within each divided segment. As should be appreciated, more than one mask may be used for a single target image, e.g., alternating phase shift mask or double dipole mask. In the following description, one mask is shown as an illustrative example for a target image for simplicity purposes. It should be appreciated that the current invention can be applied to and include the situation of multiple masks.

Next in process S3, operation controller 142 determines whether all the mask segments are checked for errors in the operation. If yes, operation controller 142 controls the operation of mask printability verification system 132 to end with the current mask layout and output verification results through outputs 166. If no, operation controller 142 controls the operation of mask printability verification system 132 to process S4.

In process S4, simulator 146 simulates the mask layout/a mask segment of the mask layout to generate a simulated image shape. For illustration purposes, it is assumed that the optional process S2 is performed and simulator 146 simulates a mask segment of the mask layout. Specifically, process S4 includes three sub-processes. In process S4-1, mask layout simplifier 150 simplifies the mask layout/mask segment in at least one of a spatial domain and a frequency domain to obtain a simplified version(s). As a consequence, the simplified version has a reduced data size compared to the original mask layout. The reduced data size of the simplified version facilitates an efficient simulation. According to one embodiment, the simplification is implemented by a smoothing process. In addition, mask layout simplifier 150 may perform multiple simplification processes to generate multiple simplified versions with a hierarchical level of simplification. FIGS. 4-8 are provided to illustrate the simplification process and the later processes of the operation of mask printability verification system 132. FIGS. 4-8 show an example of a mask segment 200 with multiple simplified versions and the respective simulated image shape according to the invention.

Figure 4:
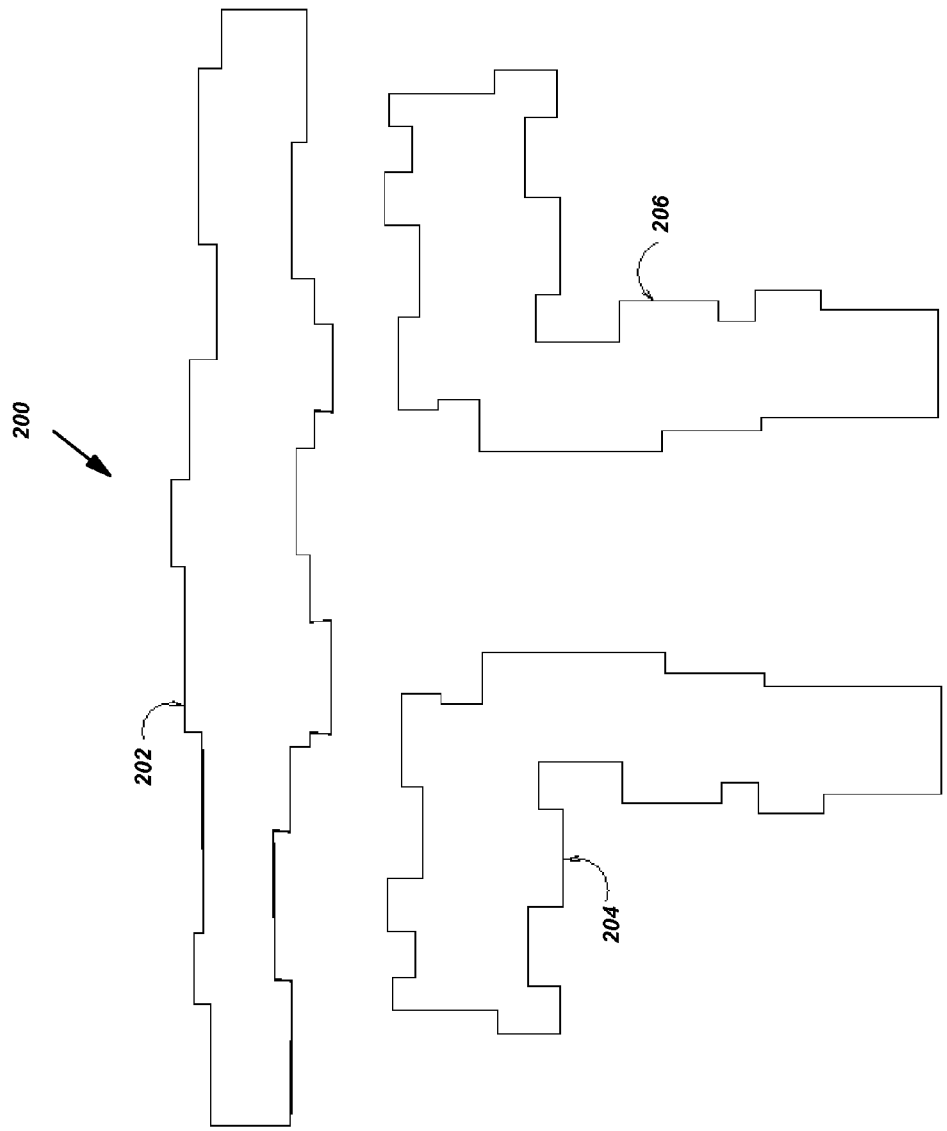
FIGS. 4-8 show an example of a mask segment with multiple simplified versions and the respective simulated image shapes according to the invention.
Figure 5:
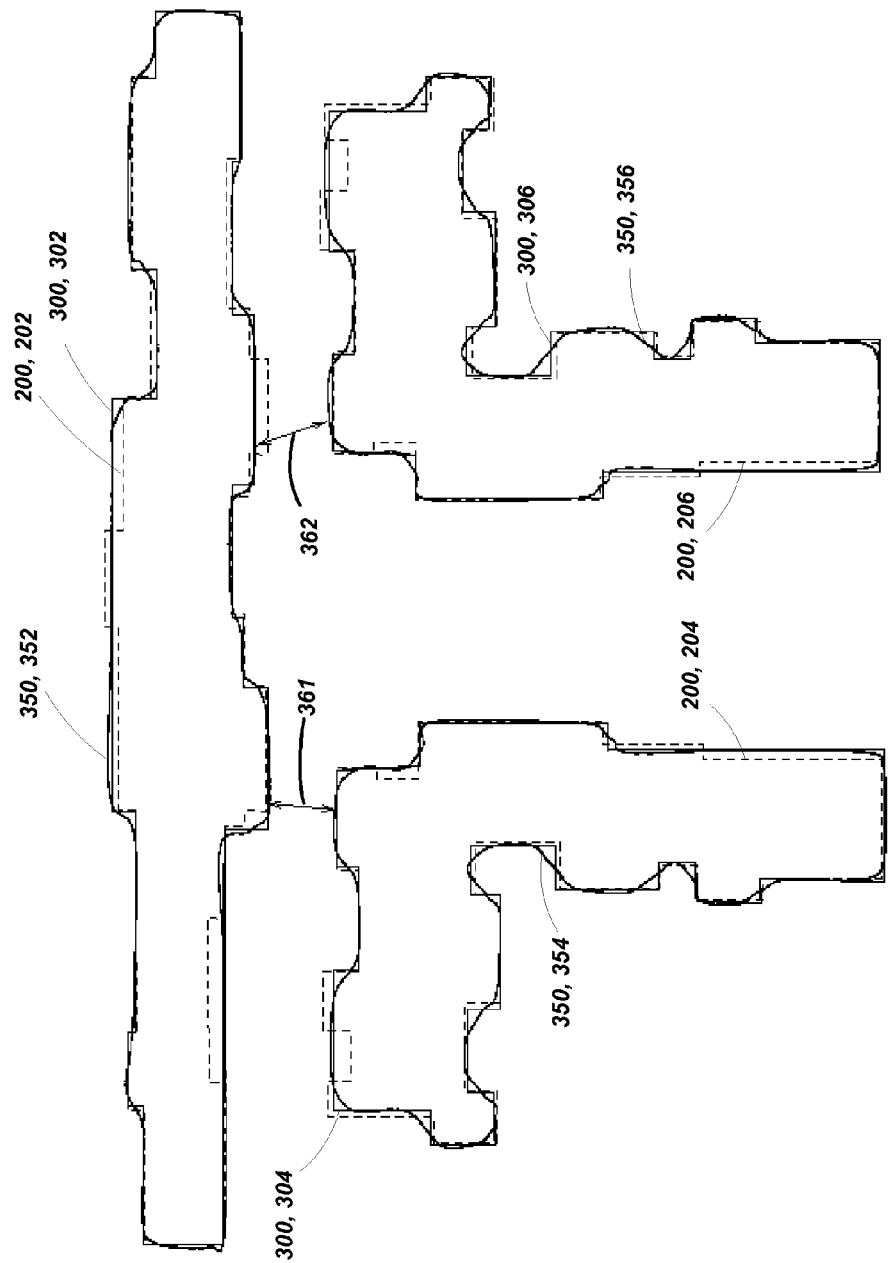

FIG. 4 shows an illustrative example of a mask segment 200 including mask shapes 202, 204 and 206. For descriptive purposes, the original mask layout/ mask segment will be referred to as "Level 1". As described above, the simplification process, e.g., smoothing, may be applied multiple times. It should be appreciated that any method of simplifying a mask segment may be used in the simplification process, and all are included in the invention. For example, a smoothing process in the spatial domain is applied to the shapes of Level 1 by a factor A. Smoothing factor A depends on the so-called Raleigh Limit that defines the limits of the resolution of an optical process. The Raleigh Limit also defines the boundary of the vicinity of a mask segment. Raleigh Limit is defined as $k_1 \square/NA$, where NA is the effective numerical aperture of the optical system, $\square$ is the wavelength of light for the exposure and $k_1$ is a variable factor. The smaller the value of factor $k_1$, the more distorted the shapes are due to the lithographic process. In other words, the system becomes less sensitive to smaller variations of the shapes. As such, in this embodiment, smoothing factor A is defined as proportional to the Raleigh Limit. There are many different ways in which a smoothing process can be implemented. For example, consecutive applications of Minkowski's sum and difference methods may be used, as should be appreciated. After the smoothing, the resulted mask shapes may be referred to as level 2. FIG. 5 shows a smoothed mask segment 300 of level 2. In FIG. 5, the shapes with dotted straight lines represent the original mask segment 200; the shapes with solid straight lines represent smoothed mask segment 300; and the shapes with curved lines represent simulated image shape 350. The above use of different patterns of lines also applies to FIGS. 6-8.

Figure 6:
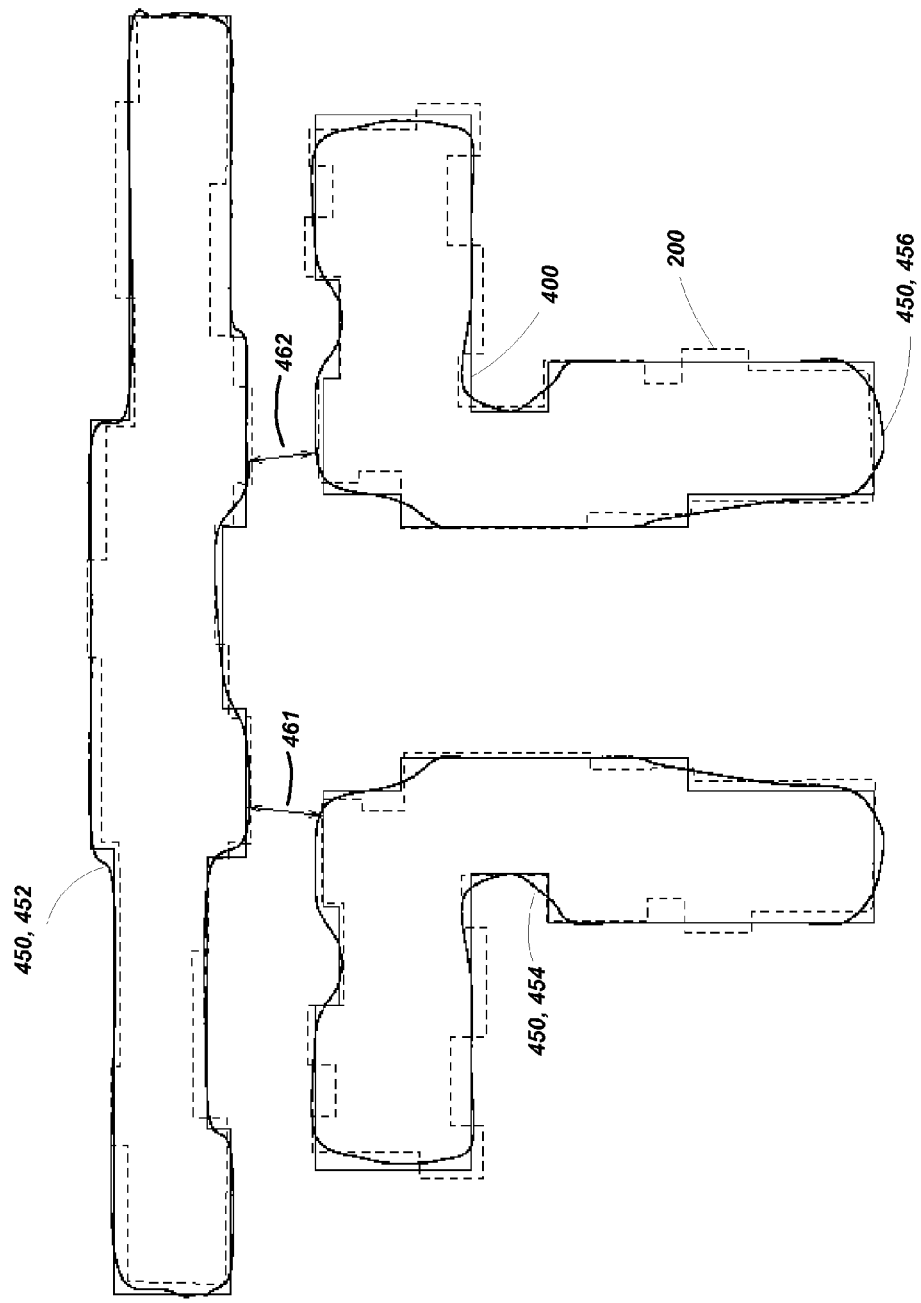
Figure 7:
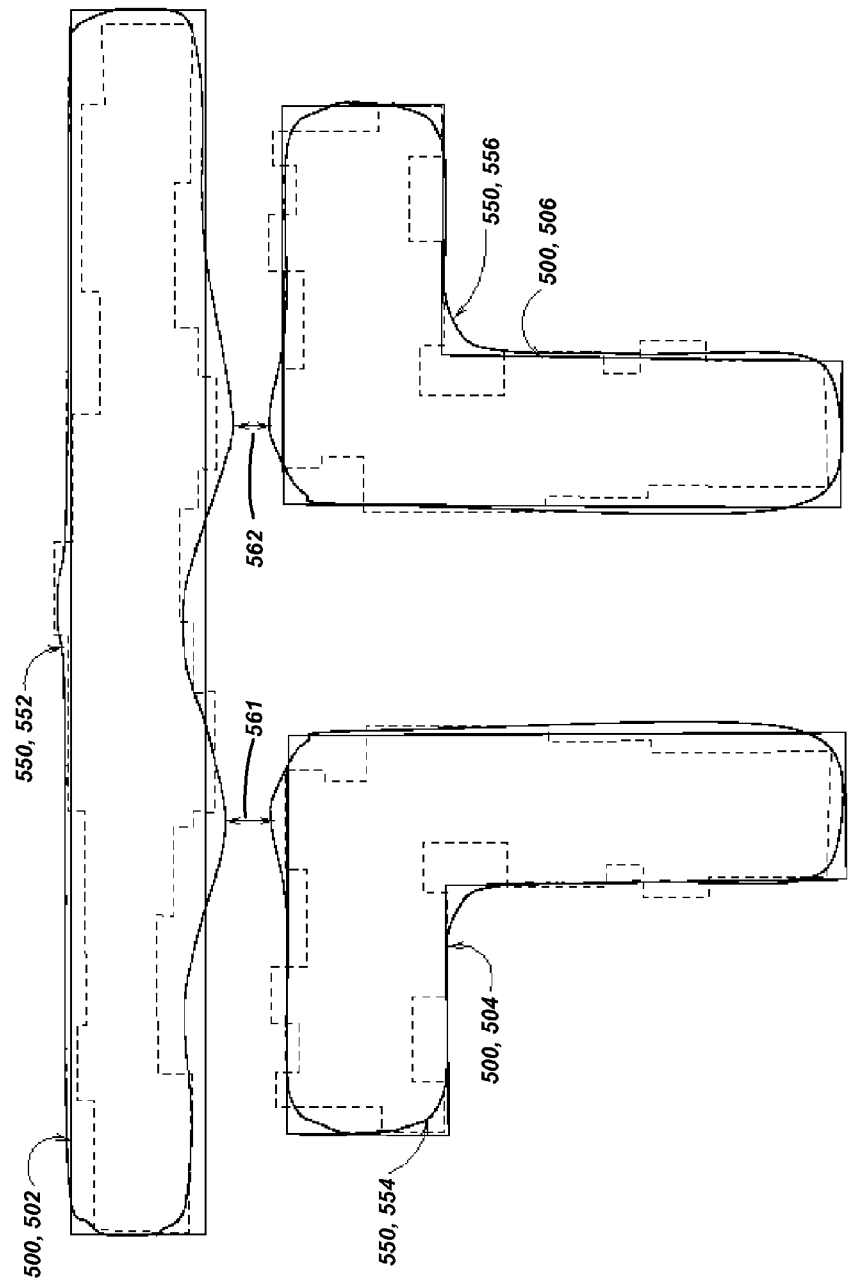

Similarly, a smoothing may be applied again on the smoothed mask shapes of level 2 by a factor A, which results in smoothed mask shapes of level 3. FIG. 6 shows smoothed mask shapes 400 of level 3. Smoothing the smoothed mask shapes of level 3 by a factor A, smoothed mask shapes 500 of level 4 may be obtained (FIG. 7). It should be appreciated that any number of simplification processes may be applied and all are included in the invention. Although FIGS. 5-7 show smoothed mask shapes in the spatial domain, simplification in the frequency domain is also possible and is included in the invention. An operator may instruct mask layout simplifier 150 regarding how many simplification processes are preferred, based on, e.g., the specific requirements of a verification task.

Returning to FIGS. 2-3, in process S4-2, simulator 146 simulates the mask layout to generate a simulated image shape. According to one embodiment, simulator 146 first simulates the mask layout with a lower accuracy. Specifically, the simulation with lower accuracy is implemented by simulating a simplified version of the mask layout. As illustrated by the above example, levels 2-4 are all simplified versions of mask layout 200 (FIG. 4), with their simplification level ordering from the least simplified to the most simplified. As is appreciated, a simulation of a more simplified version is less accurate than a simulation of a less simplified version. According to one embodiment, simulator 146 first simulates the most simplified version, e.g., level 4, and generates simulated image shape 550 (FIG. 7). As is appreciated, simulator 146 may begin simulation with any other level of accuracy/ simplified version.

In process S4-3, simulation accuracy adjuster 148 examines the simulated image shape to determine whether to adjust the simulation accuracy to a higher accuracy. Any method may be applied in the examination, and all are included in the invention. According to one embodiment, simulation accuracy adjuster 148 coordinates with error detector 152 in the examination and process S4-3 may be integrated to process S5, as shown by the dotted block in FIG. 3. That is, the simulated image shape is examined, with respect to a set of printability rules or criteria, to simultaneously determine whether to simulate the mask layout with a higher accuracy and whether the mask layout/mask segment is printable, i.e., verifying the printability of the mask layout. Any standard and any method may be used in the examining and all are included in the invention. For example, the simulated image shape may be compared to the provided target image shape to detect an error or any violation of the printability rules. For another example, rules may be set for determining whether the simulated image shape includes an error, e.g., a bridging error. According to one embodiment, in the examination of process S4-3, a tolerance threshold may be applied such that an operator can control the efficiency and accuracy of the simulation operation. The tolerance threshold may be selected based on/dependent on the level of accuracy/simplification being used in the simulation. In the integrated processes S4-3 and S5, if no error is detected, the mask segment is identified and marked as good, in process S7, and operation controller 142 controls the operation to go to process S3. If an error is detected in processes S4-3 and S5, operation controller 142 further determines, in process S6, whether a simulation with a higher accuracy is available. If yes, operation controller 142 controls the operation to go to process S4-2 to simulate the mask layout with a higher accuracy. Specifically, according to one embodiment, simulator 146 simulates the mask layout with a less simplified version (including the original mask layout) and then processes S4-3 and S5 iterate until either no error has been found or no simulation with higher accuracy is available, i.e., simulation using the original mask layout/ mask segment (Level 1 of the above example) has been performed and an error is still detected. In the later case, the specific mask segment is identified as having an error and is so marked in process S8. Operation controller 142 then controls the operation to go to process S3. As described above, in process S3, if it is determined that all mask segments have been checked, the operation of mask printability verification system 132 ends with the current mask layout and reports the mask layout as either printable, i.e., no error found, or as problematic, i.e., an error(s) found, in process S9.

If it is determined in process S3 that there is another mask segment for check, the operation begins on that mask segment. As processes S4-3 and S5 include examining a simulated image shape that is simulated based on a simplified version of the designed mask layout, this method is more effective in detecting a catastrophic error than a performance error.

FIGS. 5-8 show an example of the above operations. First, simulator 146 simulates the most simplified version Level 4 and generates, as shown in FIG. 7, simulated image shapes 550 including shapes 552, 554, and 556 corresponding to simplified mask layout shapes 502, 504, 506. The geometry of simplified mask layout shapes 502, 504, and 506 (Level 4) are considerably simpler than the corresponding geometry of the original mask shapes 202, 204 and 206 (FIG. 4), respectively. Consequently, simulating the wafer images for these simplified shapes (502, 504, and 506) are considerably more efficient than that for the original mask shapes 202, 204 and 206 (FIG. 4), respectively. Examining the resulted simulated image shapes in processes S4-3 and S5, it is detected that a bridging error exists at locations 561 and 562. As such, more accurate simulation is required.

FIG. 6 shows simulated image shapes 450 including shapes 452, 454 and 456 using Level 3 of the simplified mask layout. As Level 3 is less simplified than Level 4, simulated shapes 452, 454, and 456 are more accurate then shapes 552, 554, and 556 of FIG. 7, respectively. Applying processes S4-3 and S5, it is detected that a bridging error exists at locations 461 and 462. As such, a more accurate simulation is still required.

FIG. 5 shows simulated image shapes 350 including shapes 352, 354 and 356 using Level 2 of the simplified mask layout. As Level 2 is less simplified than Level 3, simulated shapes 352, 354, and 356 are more accurate then shapes 452, 454, and 456 of FIG. 6, respectively. Applying processes S4-3 and S5, it is detected that a bridging error exists at locations 361 and 362. As such, a more accurate simulation is still required.

Figure 8:
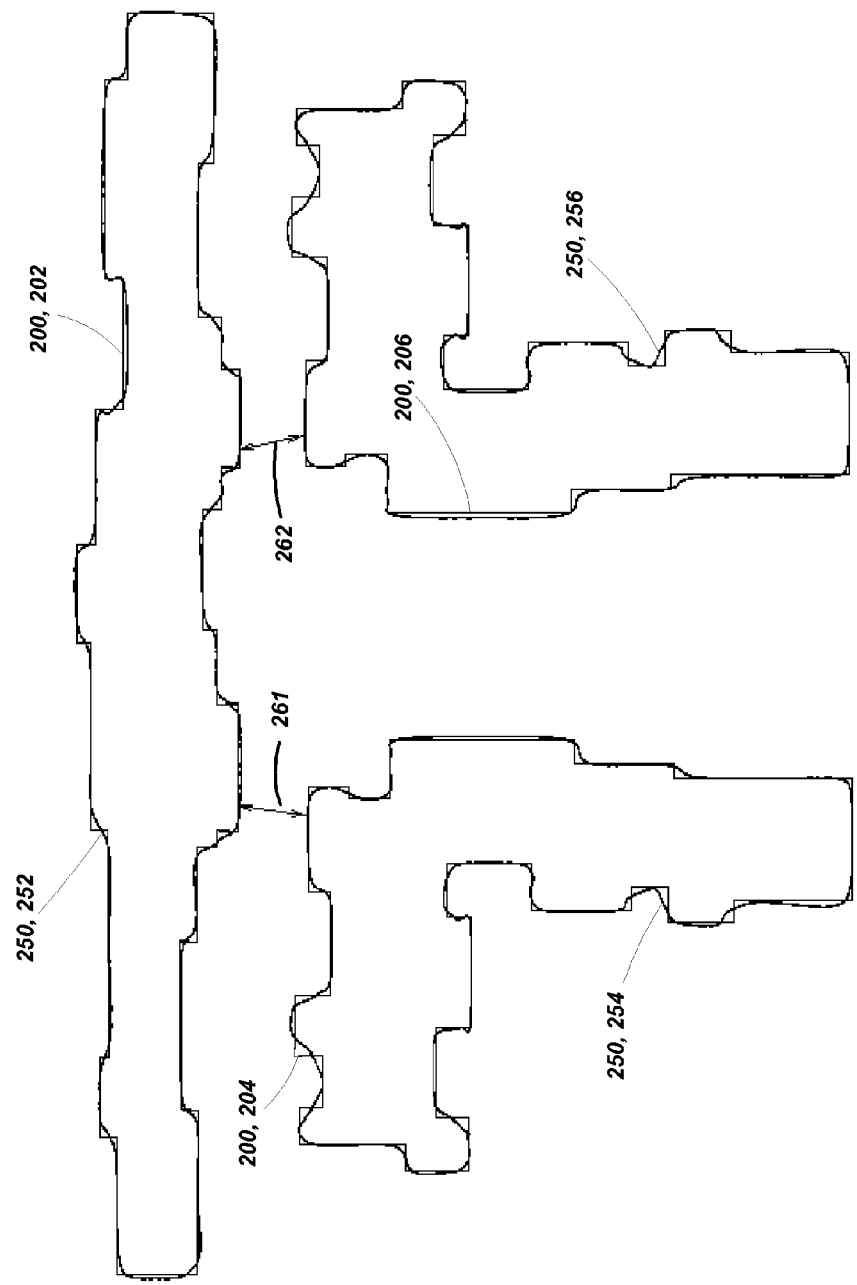

FIG. 8 shows simulated image shapes 250 including shapes 252, 254 and 256 using the original mask layout/segment, i.e., Level 1. Simulated shapes 252, 254, and 256 are more accurate then shapes 352, 354, and 356 of FIG. 5, respectively. Applying processes S4-3 and S5, it is detected that a bridging error exists at locations 261 and 262. At this stage, no simulation with more accuracy is available. As such, mask segment 200 (FIG. 4) is identified and marked as having a bridging error, and operation controller 142 controls the operation of mask printability verification system to go to process S3.

The computational advantage of this method can be easily demonstrated for the example above. For the sake of simplicity it is assumed that the simulation time for each of the fragments is the same. The number of fragments tends to diminish by at least 20% per smoothing. Therefore, in Levels 1, 2, 3, and 4 the number of fragments diminishes from 100% to 80%, 64%, 50%, respectively. In a more realistic scenario, one can expect that 90% of the regions would be exempted after using an evaluation with the simplest geometry from Level 4. For the rest, 6% can be exempted after using Level 3 and 3% can be exempted after using Level 2 and only the remaining 1% may require detailed simulation using all the fragments from Level 1. Using the above assumption, the above-described methods would run at least 48% faster than the present art. Preferably, this method may be applied to detect a catastrophic error. However, it should be appreciated that this method can be applied to detecting other types of errors and the scope of the invention and its application are not limited by any specific type of errors to be detected.

3. CONCLUSION

While shown and described herein as a method and system for verifying a printability of a mask layout, it is understood that the invention further provides various alternative embodiments. For example, in one embodiment, the invention provides a program product stored on a computer-readable medium, which when executed, enables a computer infrastructure to verify a printability of a mask layout. To this extent, the computer-readable medium includes program code, such as mask printability verification system 132 (FIG. 2), which implements the process described herein. It is understood that the term "computer-readable medium" comprises one or more of any type of physical embodiment of the program code. In particular, the computer-readable medium can comprise program code embodied on one or more portable storage articles of manufacture (e.g., a compact disc, a magnetic disk, a tape, etc.), on one or more data storage portions of a computing device, such as memory 120 (FIG. 2) and/or database 128 (FIG. 2), and/or as a data signal traveling over a network (e.g., during a wired/wireless electronic distribution of the program product).

In another embodiment, the invention provides a method of generating a system for verifying a printability of a mask layout. In this case, a computer infrastructure, such as computer system 100 (FIG. 2), can be obtained (e.g., created, maintained, having been made available to, etc.) and one or more systems for performing the process described herein can be obtained (e.g., created, purchased, used, modified, etc.) and deployed to the computer infrastructure. To this extent, the deployment of each system can comprise one or more of: (1) installing program code on a computing device, such as computing system 100 (FIG. 2), from a computer-readable medium; (2) adding one or more computing devices to the computer infrastructure; and (3) incorporating and/or modifying one or more existing systems of the computer infrastructure to enable the computer infrastructure to perform the process processes of the invention.

In still another embodiment, the invention provides a business method that performs the process described herein on a subscription; advertising supported, and/or fee basis. That is, a service provider could offer to verify a printability of a mask layout as described herein. In this case, the service provider can manage (e.g., create, maintain, support, etc.) a computer infrastructure, such as computer system 100 (FIG. 2), that performs the process described herein for one or more customers and communicates the results to the one or more customers. In return, the service provider can receive payment from the customer(s) under a subscription and/or fee agreement and/or the service provider can receive payment from the sale of advertising to one or more third parties.

As used herein, it is understood that the terms "program code" and "computer program code" are synonymous and mean any expression, in any language, code or notation, of a set of instructions that cause a computing device having an information processing capability to perform a particular function either directly or after any combination of the following: (a) conversion to another language, code or notation; (b) reproduction in a different material form; and/or (c) decompression. To this extent, program code can be embodied as one or more types of program products, such as an application/software program, component software/a library of functions, an operating system, a basic I/O system/driver for a particular computing and/or I/O device, and the like.

Further, it is understood that the terms "component" and "system" are synonymous as used herein and represent any combination of hardware and/or software capable of performing some function(s).

The flowcharts and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems which perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, processes, operations, elements, and/or components, but do not preclude the presence or addition of one or more other features, integers, processes, operations, elements, components, and/or groups thereof.

Although specific embodiments have been illustrated and described herein, those of ordinary skill in the art appreciate that any arrangement which is calculated to achieve the same purpose may be substituted for the specific embodiments shown and that the invention has other applications in other environments. This application is intended to cover any adaptations or variations of the present invention. The following claims are in no way intended to limit the scope of the invention to the specific embodiments described herein.

What is claimed is:

1. A computer-implemented method for verifying a printability of a mask layout for a photolithographic process, the method comprising:

providing, by a computer, a mask layout;

simulating the mask layout to generate a simulated image shape; and verifying the printability of the mask layout based on the simulated image shape;

wherein the mask layout simulation includes:

simulating the mask layout with a first accuracy to produce the simulated image shape, and examining the simulated image shape to determine whether to adjust a simulation accuracy to a second higher accuracy based a tolerance threshold, the tolerance threshold being selected based on the first accuracy of the simulation;

wherein the simulation with the first accuracy is implemented by simulating a simplified version of the mask layout, wherein the simplified version is obtained by simplifying the mask layout in at least one of a spatial domain and a frequency domain using a smoothing process, and the simplified version has a reduced data size compared to the mask layout;

performing a simulation with the second higher accuracy in response to an error being detected in the simulated image shape; and dividing a target image shape into target image segments and dividing the mask layout into mask segments corresponding to each of the target image segments, wherein the simulating and verifying are performed on each mask segment.

2. A system for verifying a printability of a mask layout for a photolithographic process, the system comprising:

means for receiving a mask layout;

means for simplifying the mask layout to obtain a simplified version by smoothing the mask layout in at least one of a spatial domain and a frequency domain;

means for simulating the mask layout to generate a simulated image shape;

means for verifying the printability of the mask layout based on the simulated image shape;

wherein the simulation means includes means for adjusting an accuracy of the mask layout simulation, and the mask layout simulation includes:

simulating the mask layout with a first accuracy to produce the simulated image shape, and examining the simulated image shape to determine whether to adjust a simulation accuracy to a second higher accuracy;

wherein the simulation with the first accuracy is implemented by simulating the simplified version;

means for performing a simulation with the second higher accuracy in response to an error being detected in the simulated image shape; and means for dividing a target image shape into target image segments and for dividing the mask layout into mask segments corresponding to each of the target image segments, wherein the simulating and verifying are performed on each mask segment.

3. A computer program product comprising:

computer usable program code which stored in a computer readable storage device, the program code when executed by a computer system, is configured to:

receive data for a mask layout;

simulate the mask layout to generate a simulated image shape; and verify the printability of the mask layout based on the simulated image shape;

wherein the mask layout simulation includes:

simulating the mask layout with a first accuracy to produce the simulated image shape, and examining the simulated image shape to determine whether to adjust a simulation accuracy to a second higher accuracy based a tolerance threshold, the tolerance threshold being selected based on the first accuracy of the simulation;

wherein the simulation with the first accuracy is implemented by simulating a simplified version of the mask layout, wherein the simplified version is obtained by simplifying the mask layout in at least one of a spatial domain and a frequency domain using a smoothing process, and the simplified version has a reduced data size compared to the mask layout;

perform a simulation with the second higher accuracy in response to an error being detected in the simulated image shape; and divide a target image shape into target image segments and dividing the mask layout into mask segments corresponding to each of the target image segments, wherein the simulating and verifying are performed on each mask segment.

* * * * *